(12) United States Patent
Fischer et al.

(10) Patent No.: US 10,546,866 B2
(45) Date of Patent: Jan. 28, 2020

(54) MEMORY ARRANGEMENT AND DETECTION CIRCUIT FOR DATA PROTECTION

(71) Applicant: Infineon Technologies AG, Neubiberg (DE)

(72) Inventors: Wieland Fischer, Munich (DE); Bernd Meyer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/040,075

(22) Filed: Jul. 19, 2018

(65) Prior Publication Data

US 2019/0027485 A1  Jan. 24, 2019

(30) Foreign Application Priority Data

Jul. 19, 2017  (DE) .................. 10 2017 116 280

(51) Int. Cl.

| | |
|---|---|
| *H01L 27/11524* | (2017.01) |
| *G11C 8/16* | (2006.01) |
| *G11C 11/56* | (2006.01) |
| *G11C 16/04* | (2006.01) |
| *G11C 16/24* | (2006.01) |
| *G11C 16/26* | (2006.01) |

(52) U.S. Cl.
CPC ......... *H01L 27/11524* (2013.01); *G11C 8/16* (2013.01); *G11C 11/5628* (2013.01); *G11C 16/0458* (2013.01); *G11C 16/0475* (2013.01); *G11C 16/24* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 2001/0053225 A1* | 12/2001 | Ohira | .................... | H04L 1/0083 380/239 |
| 2005/0160350 A1* | 7/2005 | Dror | ................ | H03M 13/2906 714/800 |
| 2012/0327699 A1* | 12/2012 | Ramaraju | ............ | G11C 29/024 365/94 |

(Continued)

*Primary Examiner* — J. H. Hur
(74) *Attorney, Agent, or Firm* — Schiff Hardin LLP

(57) ABSTRACT

A memory arrangement having a memory cell array, wherein each column is associated with a bit line and each row is associated with a word line, wherein the columns have first columns of memory cells that store useful data, and columns of memory cells of a second column type that store prescribed verification data, wherein during a read access operation the memory cells of at least the columns of memory cells of the second column type set the associated bit line to a value that corresponds to a logic combination of the values stored by the memory cells of the column of the second column type that belong to rows of memory cells addressed during the read access operation, and a detection circuit that is configured to, during a read access operation, detect whether a bit line associated with a column of memory cells of the second column type is set to a value that corresponds to the logic combination of values stored by memory cells of the column of the second column type of memory cells and whose values belong to different rows of memory cells.

12 Claims, 5 Drawing Sheets

(56) References Cited

U.S. PATENT DOCUMENTS

2015/0243368 A1\* 8/2015 Remington .......... G11C 29/024
   365/94
2016/0164543 A1\* 6/2016 Kumar .............. H03M 13/2909
   714/755
2017/0093435 A1\* 3/2017 Ikegaya .............. H03M 13/036

\* cited by examiner

MEMORY ARRANGEMENT AND DETECTION CIRCUIT FOR DATA PROTECTION

Exemplary embodiments relate generally to memory arrangements.

Electronic devices need to be protected against attacks in a multiplicity of applications. A typical example is chip cards processing and storing secret data (e.g. keys or passwords) or data intended to be protected against manipulation (e.g. credit on a prepaid card), or else controllers, for example in a vehicle, whose correct operation is important to the safety of a user. A possible point of attack on an electronic device is its memory, manipulation of which allows an attacker to find out secret data or to impair correct operation of the electronic device. Therefore, efficient mechanisms for protecting electronic memories are desirable.

According to one embodiment, a memory arrangement is provided that has a memory cell array with columns and rows of memory cells, bit lines and word lines, wherein each column is associated with a bit line and each row is associated with a word line, wherein the columns of memory cells have columns of memory cells of a first column type that are set up to store useful data, and have columns of memory cells of a second column type that are set up to store prescribed verification data. The memory cells of at least the columns of memory cells of the second column type are set up, and connected to the bit lines, such that during a read access operation the memory cells of a column of memory cells set the bit line associated with the column to a value that corresponds to a logic combination of the values stored by the memory cells of the column that belong to rows of memory cells addressed during the read access operation. The memory arrangement has a detection circuit that is set up so as, during a read access operation, to detect whether a bit line associated with a column of memory cells of the second column type is set to a value that corresponds to the logic combination of values stored by memory cells of the column of memory cells of the second column type and whose values belong to different rows of memory cells.

The figures do not reproduce the actual proportions but rather are intended to be used to illustrate the principles of the various exemplary embodiments. Various exemplary embodiments are described below with reference to the following figures.

The detailed description that follows relates to the accompanying figures, which show details and exemplary embodiments. These exemplary embodiments are described in such detail that a person skilled in the art is able to implement the subject matter of the disclosure. Other embodiments are also possible and the exemplary embodiments can be changed in structural, logical and electrical respects without departing from the subject matter of the disclosure. The various exemplary embodiments are not necessarily mutually exclusive but rather different embodiments can be combined with one another, so that new embodiments arise. Within the context of this description, the terms "connected" and "coupled" are used to describe both a direct and an indirect connection and a direct or indirect coupling.

Electronic memories typically have a grid (two-dimensional array or matrix) of memory cells, wherein the rows are addressed by word lines and the columns are addressed by bit lines.

Figure 1:
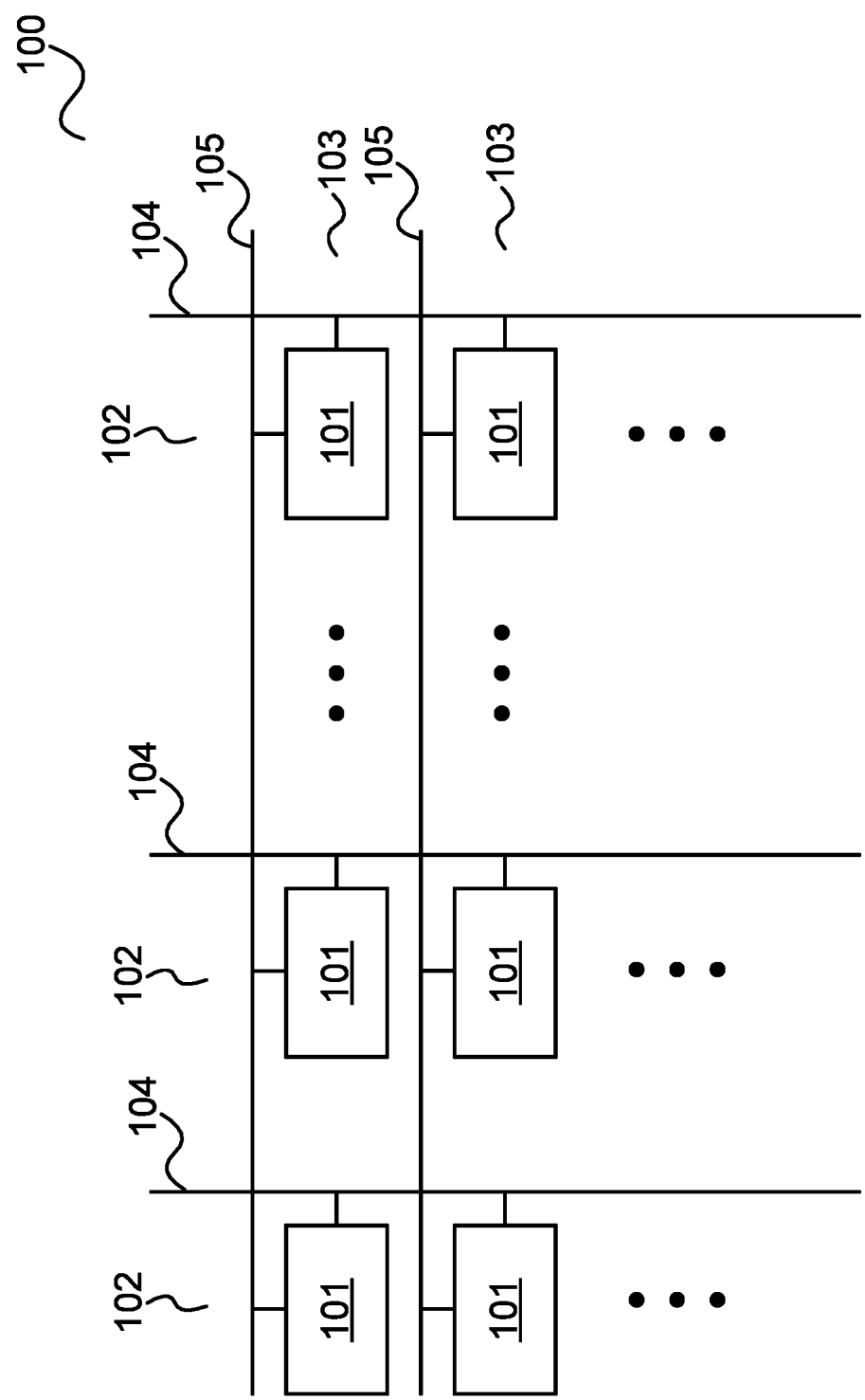
FIG. 1 shows a memory cell array.

FIG. 1 shows a memory cell array 100.

The memory cell array has a multiplicity of memory cells 101 arranged in the form of a matrix having columns 102 of memory cells and rows 103 of memory cells.

Each column 102 of memory cells has an associated bit line 104, and each row 103 of memory cells has an associated word line 105.

Activation of a word line 105 allows all (or some of the) memory cells of the row 103 addressed via this word line (i.e. of the row 103 associated with this word line) to be read or written to by means of the bit lines 104 at the same time.

To allow as space-saving a design of a memory as possible, all memory cells addressable by a given bit line (i.e. all memory cells associated with a bit line, i.e. connected to the bit line) may be connected to the bit line by means of a specific circuitry ("open drain" or "wired-or"). An example of such a circuitry is shown in FIG. 2.

Figure 2:
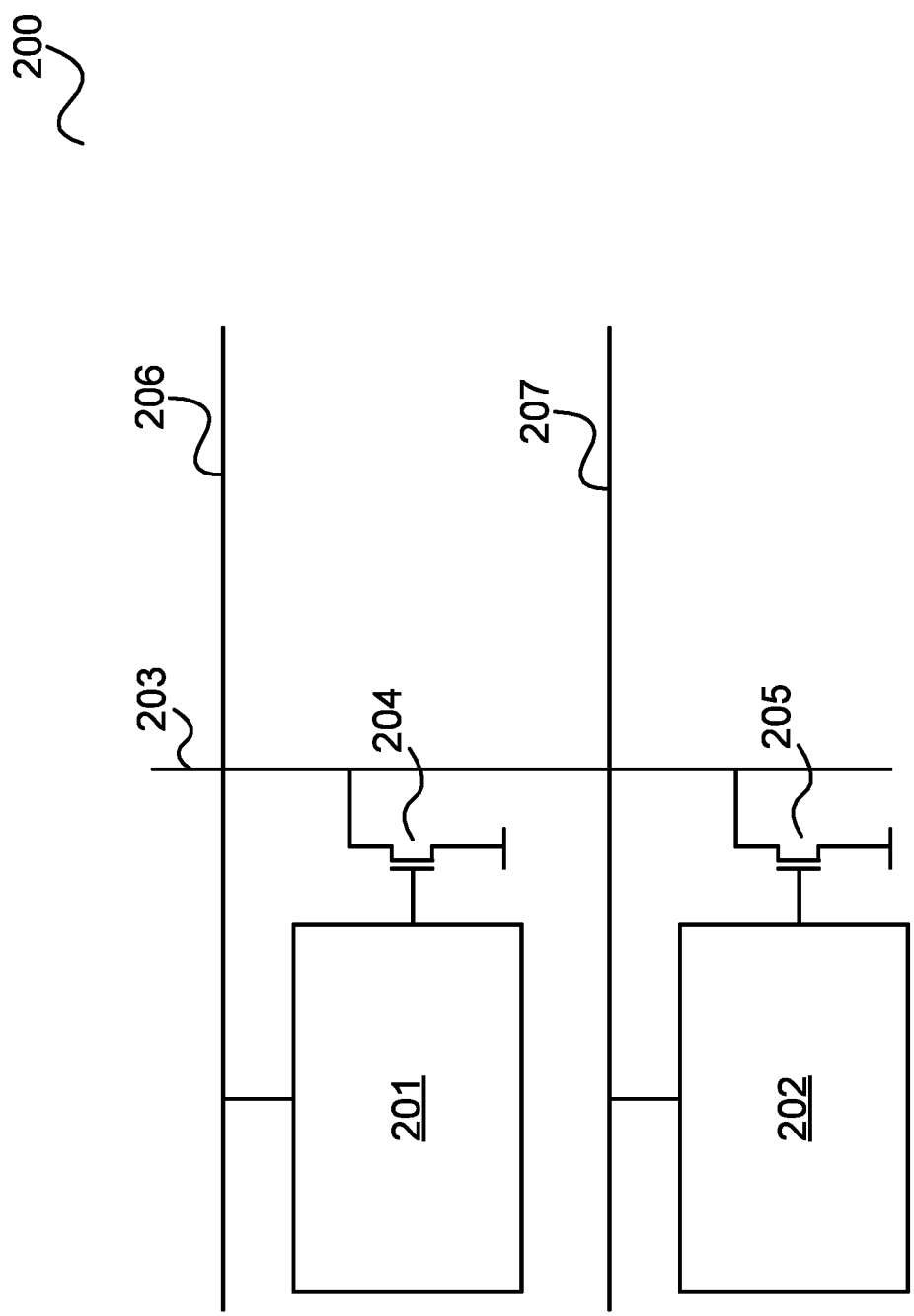
FIG. 2 shows two memory cells associated with the same bit line and connected to the bit line by means of a respective pull-down transistor.

FIG. 2 shows two memory cells 201, 202 associated with the same bit line 203 and connected to the bit line 203 by means of a respective pull-down transistor 204, 205.

Each of the memory cells 201, 202 is moreover connected to a respective word line 206, 207.

In this example, during a read access operation, for example, the bit line 203 is precharged to a high level (using what is known as a "precharge"), one of the word lines 206, 207 is activated and the memory cell 201, 202 associated with the activated word line 206, 207 pulls or does not pull, depending on whether it stores a 1 or a 0, the bit line 203 downward (to a low level).

If a stored 0 corresponds to an activation of the respective pull-down transistor 204, 205, for example, then the memory cell 201, 202 pulls the bit line 203 to the low level if it stores a 0, this then being interpreted as output of a 0 onto the bit line 203.

If both word lines 206, 207 are now activated, it suffices for one of the two memory cells 201, 202 to store a 0 in order to pull the bit line 203 downward. Conversely, the bit line 203 remains at the high level only if both memory cells 201, 202 store a 1. Therefore, when multiple word lines are activated at the same time, the bit line 203 is set to a logic combination, in this example an AND combination, of the stored values (since the bit line remains at the 1 only if both memory cells 201, 202 store a 1).

Depending on which voltage levels have an associated stored 1 and an associated stored 0 and whether or not a pull-up transistor is used instead of the pull-down transistor 204, 205, it is also possible for an OR combination of the values stored by the memory cells 201, 202 to arise as the value to which the bit line 203 is set and which is output by the bit line 203.

Connection of memory cells to a bit line by means of a circuitry as described with reference to FIG. 2 allows transistors to be saved and is not a functional limitation for the normal operation of a memory array. The fact that the simultaneous addressing of multiple word lines results in a logic combination of memory content being output to a bit line, however, provides an attacker with opportunities to carry out particular attacks:

if an attacker uses an invasive attack during read access to the memory to activate multiple word lines of the memory cell array at the same time (for example by virtue of a forcing attack by means of probing needles or by laser), then this circuitry implicitly causes, on a bit line, a logic operation for all simultaneously activated memory cells associated with this bit line to be read. As explained above, depending on the circuitry and the design of the memory cell array, the result of this implicit calculation is the logic AND combination or the logic OR combination of the simultaneously activated (i.e. addressed by the word lines) memory cells associated with this bit line similarly, an attacker, if activating multiple word lines of the memory cell array at the same time during a write access operation, can create undesirable copies of the data to be stored at further, unused places in the memory cell array. Such a copy can then be loaded again by the attacker at a later time during a read access operation by activating suitable word lines, and this allows him to produce a false system state (and hence to perform what are known as "cloning" and "replay" attacks). In this manner, an attacker can prevent, for example, counters intended to represent a monetary value or to detect brute force attacks on PINs and passwords from running and triggering a security alarm.

For security applications, memory cell arrays can be extended by codings of the addresses of word lines in order to be able to detect sporadic transient addressing errors on word lines or permanent defects in the cell array. To this end, precomputed bit patterns are permanently inserted into the cell array, for example. This can be accomplished using techniques such as in the case of ROM memory cells or by means of suitable alteration of the memory cells used, for example (for example missing contacts or missing transistors in individual memory cells). Although these techniques allow the detection of malfunctions with a prescribed redundancy, they are typically unsuitable for providing protection against active attackers. Moreover, the linear codes typically used for efficiency reasons are not compatible with the bit-by-bit logic AND or logic OR functions by multiple activated word lines. Linear codes are usually defined as vector spaces using a finite body and retain their properties only in regard to the logic maps in this vector space. An invasive attacker can deliberately exploit this incompatibility of the logic maps in the portions of the cell array that encode the addresses of the word lines, in order to bypass the error-detecting properties of the code used by means of simultaneous activation of multiple word lines. If the data that are read do not contain any further redundant information for verification of their validity, such an attack is undetectable.

As arrays of memory cells are firstly very easily detectable in the layout of an integrated circuit on account of their size and are secondly easily analyzable and manipulable as a result of their orderly regular design, integrated circuits for security applications need to be able to verify during operation that data are read from the correct memory cells of a memory cell array that are addressed by the application or are written to the correct addressed memory cells. Besides the verification of the physical address of the memory cells actually used for reading or writing, this also in particular includes a mechanism in order to protect themselves against attacks by simultaneous activation of multiple word lines in a memory cell array.

The text below describes such a mechanism based, according to one exemplary embodiment, on special data patterns that can be appended to the word lines of a memory array as fixed (e.g. ROM) patterns, for example, and are readable via additional bit lines. These data patterns allow an attack activating multiple word lines at the same time to be reliably detected with a prescribed redundancy of the alarm lines for signaling the detected attack.

Figure 3:
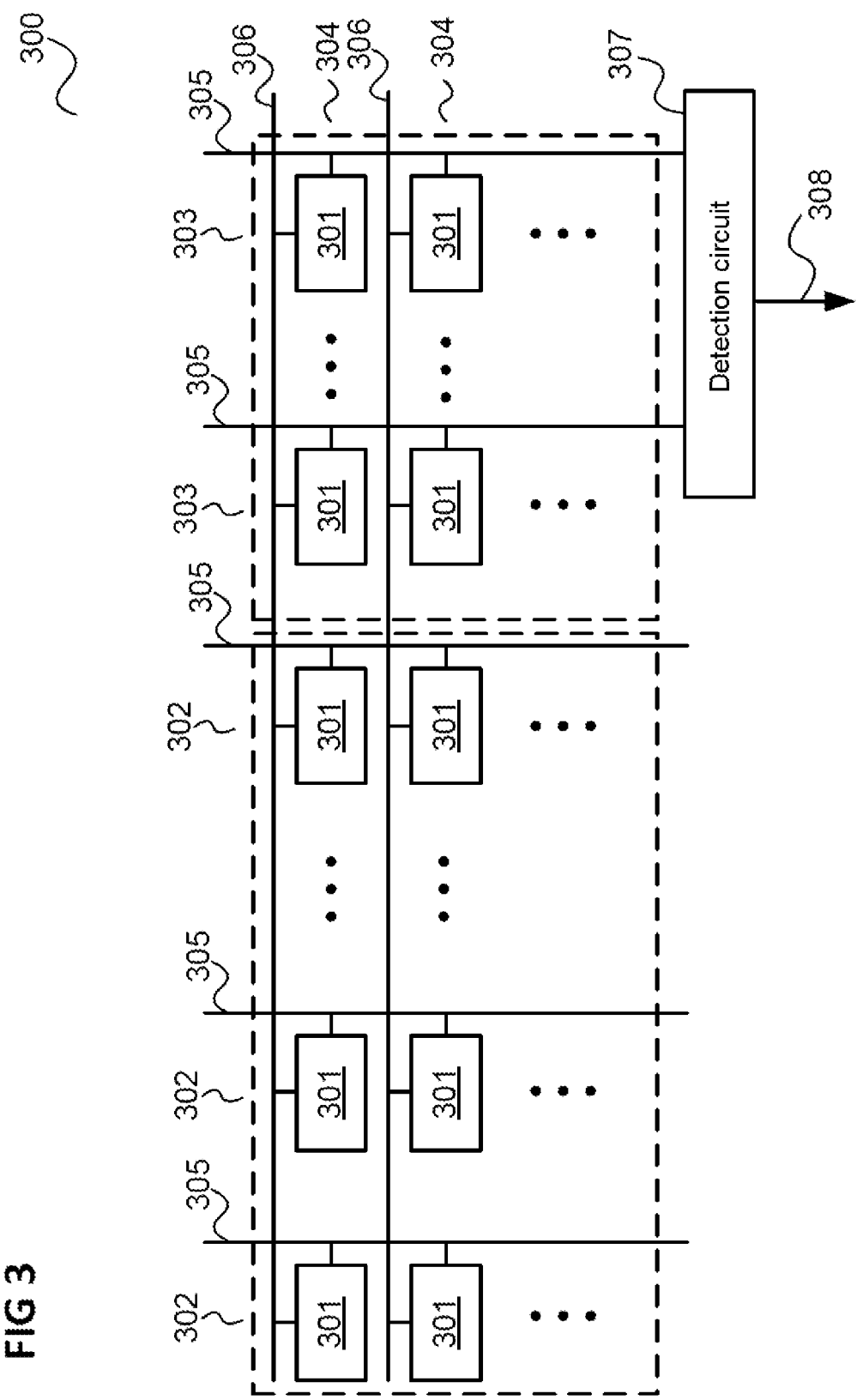
FIG. 3 shows an extension of a memory cell array with memory cells for storing verification data based on simultaneous activation of multiple word lines.

FIG. 3 shows an extension of a memory cell array with memory cells for storing verification data, e.g. code words or data patterns, to protect against attacks based on simultaneous activation of multiple word lines.

Similarly to the memory cell array 100 of FIG. 1, the memory cell array 300 has a multiplicity of memory cells 301 arranged in the form of a matrix having columns 302, 303 of memory cells and rows 304 of memory cells, wherein in this example the memory cell array 300 has first columns 302 of memory cells (also referred to as columns of a first column type) for storing useful data (i.e. for example "normal" memory cells that can be used normally, for example can be written to by a processor of an electronic apparatus, e.g. a chip card or a controller, for storing data) and second columns 303 of memory cells (also referred to as columns of a second column type) for storing verification data.

Each column 302, 303 of memory cells has an associated bit line 305, and each row 304 of memory cells has an associated word line 306.

The second columns 303 can be regarded as an extension of the memory cell array, consisting of the first columns 302. In other words, according to one embodiment, the word lines of a memory cell array are lengthened and further memory cells and associated bit lines are added. In this manner, the additional memory cells, i.e., the memory cells of the second columns 303, can be used to insert precomputed bit patterns (for example permanently) into the memory cell array.

These precomputed bit patterns can be read by means of the further bit lines (i.e. bit lines 305 associated with the second columns 303). The memory cells of the second columns 303 are set up, and connected to the associated bit lines, such that simultaneous activation of multiple word lines 306 result in these bit lines being subject to the same bit-by-bit logic AND or OR functions for all activated memory cells as the other areas of the memory cell array, i.e. as the bit lines associated with the first columns 302 of memory cells.

In the examples that follow it is assumed that memory cells of simultaneously activated word lines associated with the same bit line set the bit line to the logic OR function for the bits they store, but they can be used analogously for a logic AND function.

According to one embodiment the memory cells of the second columns 303 store precomputed bit patterns, wherein all memory cells of a row 304 that belong to the second columns 303 store a precomputed bit pattern, i.e. a precomputed bit pattern belongs to each memory cell array 304, and wherein it holds that:

A) All precomputed bit patterns have the same Hamming weight w>0 in order to allow as efficient a detection as possible when there is no error.

B) If two or more word lines are activated at the same time, the Hamming weight of the resultant pattern arising from the bit-by-bit logic OR function for of the bit patterns belonging to the rows of memory cells associated with the activated word lines has at least w+d where d>0 is a prescribed constant for the redundancy of the detection of the simultaneous activation of multiple word lines.

Figure 4:
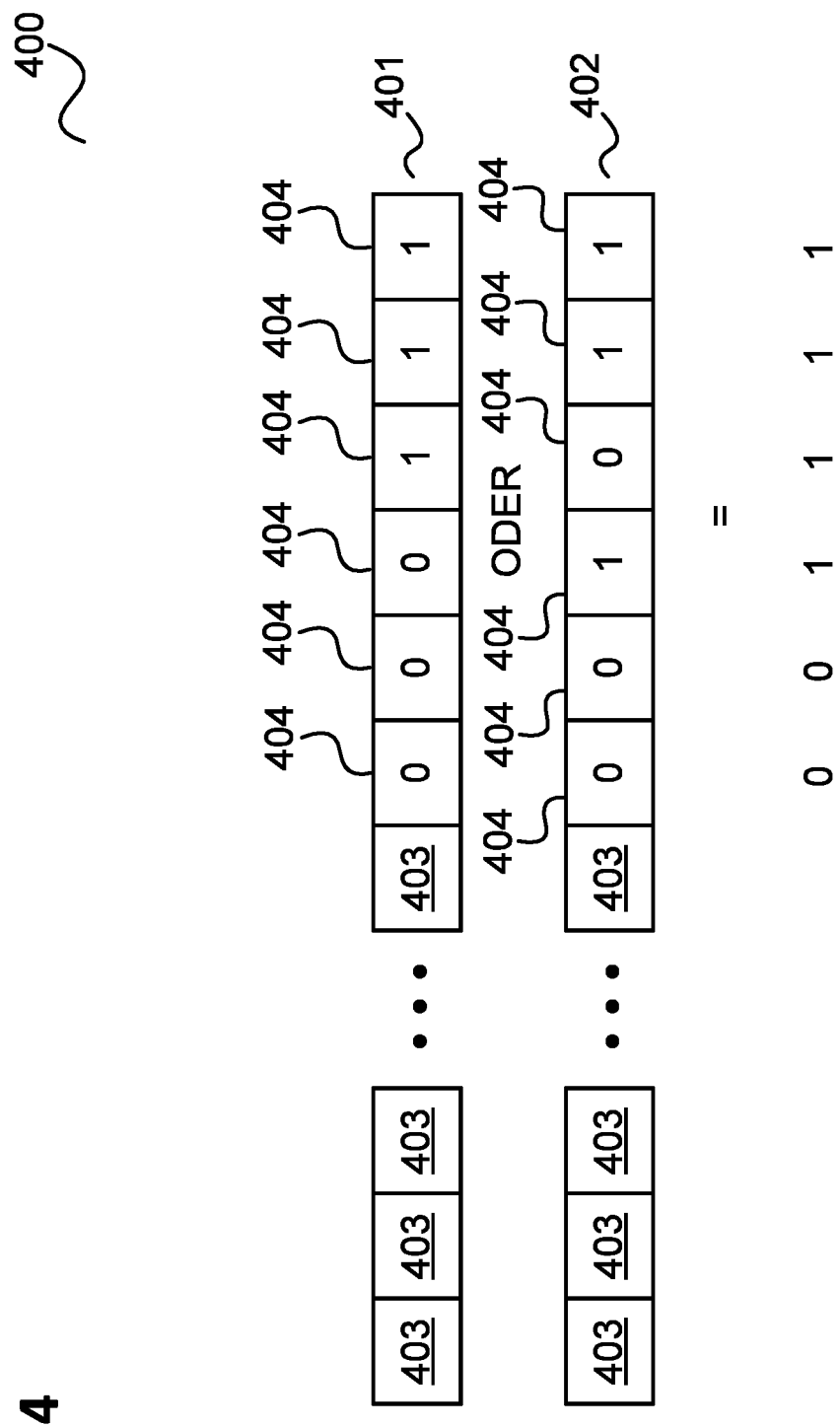
FIG. 4 shows an example of two memory cell rows each storing a precomputed bit pattern.

FIG. 4 shows an example of two memory cell rows 401, 402, each storing a precomputed bit pattern.

Each memory cell row 401, 402 has first memory cells 403, belonging to first memory cell columns, for storing useful data and second memory cells 404 for storing verification data, in this case precomputed bit patterns of 6-bit length.

In this example, the first memory cell row 401 stores the bit pattern 000111 and the second memory cell row 402 stores the bit pattern 001011.

According to A), both bit patterns have the same Hamming weight w=3.

According to B), the resultant bit pattern obtained from an OR combination of the two bit patterns has a weight that is greater than 3, namely 4 (the weight of 001111, the bit-by-bit OR combination of 000111 and 001011).

On the basis of A) and B), a detection circuit 307 connected to the bit lines associated with the second columns can proceed as follows for detecting an attack based on simultaneous activation of multiple word lines: in the resultant bit pattern output by the bit lines associated with the second columns 303, it determines the number x of bits having the value 1 and compares this number with the Hamming weight w of the original precomputed bit patterns. If x>w, this indicates the simultaneous activation of multiple word lines.

If the six bit lines connected to the second memory cells 404 of the example of FIG. 4 deliver the pattern 001111, for example, then the detection circuit 307 can establish that the weight of the resultant pattern is greater than the weight of the precomputed bit patterns (4>3) and can react accordingly, e.g. can output an alarm signal via an alarm signal output line 308 of the detection circuit 307, for example to a processor of the respective electronic apparatus or else to a reset circuit that resets the electronic device in the event of an alarm (and e.g. in particular erases the memory).

The value d can be regarded as redundancy for the detection of simultaneous activation of multiple word lines. An attacker would need to manipulate the resultant pattern at d places in order to achieve simultaneous activation of multiple word lines without this being detected. In order to achieve a desired redundancy d overall (i.e. for the entire system comprising memory and detection circuit), the detection circuit (and a respective alarm signal output line 308) may be provided d times in total for example. There is thus d-fold redundancy even at the level of the detection circuits. As a result, an attacker needs to manipulate d detection circuits in order to achieve simultaneous activation of multiple word lines without this being detected.

Detection based on precomputed bit patterns having a particular weight and the ascertainment of the weight of a resultant (output) bit pattern as described above can be realized by means of simple decoding of the resulting bit pattern (ascertainment of its weight). As such, the detection circuit 307 can be realized by a simple circuit for distinguishing whether a single word line or multiple word lines were activated at the same time. This circuit merely needs to determine the Hamming weight of the bit pattern read from the second columns 303 of the memory cell array and to compare it with a prescribed reference value (the Hamming weight w) and to output an alarm signal on the basis of the comparison result. A desired d-fold redundancy of the hardware of the detection circuit can be attained by means of d-fold replication of the circuit.

Suitable bit patterns for marking the additional cells in the memory array can be obtained in a simple manner from linear codes. The text below describes a generic construction method for producing suitable bit patterns having the desired properties A) and B). The examples that follow assume that the logic combination is an OR combination. However, bit patterns for a logic AND function that involve the Hamming weight of the resultant bit pattern for simultaneous activation of multiple word lines being accordingly reduced in comparison with the Hamming weight of the precomputed bit patterns can be determined in an analogous manner.

The construction method described below firstly proves the existence of suitable bit patterns complying with A) and B) and secondly provides an upper limit for the length of suitable bit patterns for marking word lines.

Let there be a linear (n, k, d) code for $GF_2$ (finite body having two elements) of length n, dimension k and redundancy d. There then exists a (2n, k, d) bit pattern set of $2^k$ bit patterns of length 2n for marking word lines, so that simultaneous activation of multiple word lines is detectable with d-fold redundancy: if $x=(x_n, \ldots, x_1)$ is a code word for the linear code, then an associated bit pattern y is provided by $y=(y_n, \ldots, y_1)$, where it holds that $y_i=01$, if $x_i=0$ and $y_i=10$, if $x_i=1$, for $1 \leq i \leq n$.

If each row of a memory cell array is marked with a bit pattern y generated in this manner, then all the marking bit patterns y have the Hamming weight HW(y)=n after construction. The properties of the linear code used moreover ensure that two different bit patterns differ by virtue of at least d bit pairs $y_i$. If at least two word lines are now activated at the same time, then bit pairs "01" and "10" at at least d places are altered by the logic OR function to produce "11" patterns. As a result, the Hamming weight of the resultant bit pattern increases by at least the demanded amount d.

Assuming that marking patterns of length n contain the bit 1 precisely e times and the bit 0 (n-e) times, it conversely holds that there is, for each marking pattern y with redundancy d for the detection of multiple activated word lines, an environment comprising at least U(n, e, d) patterns with e times 1 and (n-e) times 0, which cannot be used as marking patterns because they differ from the marking pattern y in fewer than d places. It is thus possible to determine lower limits for the length n of a marking pattern according to the disclosure.

An example of bit patterns for marking word lines arises when the set of all bit sequences having a fixed number of bits having the value 1 is considered. As such, by way of example, 16 arbitrary elements of the set M={000111, 001011, 001101, 001110, 010011, 010101, 010110, 011001, 011010, 011100, 100011, 100101, 100110, 101001, 101010, 101100, 110001, 110010, 110100, 111000} each result in a (6, 4, 1) marking pattern. Two respective patterns differ at at least one position. Generally, it holds that such bit patterns must satisfy the inequation $$2^k \leq \binom{n}{\lfloor n/2 \rfloor}$$

In a further exemplary embodiment the 16 elements from the set M are selected such that the simplest possible decoding of the address of the marked word line is achieved, i.e. each word line has, in a simple manner, an explicitly associated bit pattern that allow reconstruction of the address of the activated word line from the value of the associated marking pattern from M in an efficient manner: by way of example, the set M contains the 14 patterns 000111, 001011, 001101, 010011, 010101, 011001, 011100, 100011, 100101, 101001, 101100, 110001, 110100, 111000, the top 4 bits of which are depicted by their ordinal number in binary representation for the order in which they are indicated. For 16 bit patterns, two arbitrary patterns can be selected from the remaining six elements of the set M to the zero-th bit pattern and 15th bit pattern. A decoder for the address of a word line then only needs to detect the special cases for 0 and 15. In all other cases, it outputs the top 4 bits of the bit pattern. In this case, the marking patterns likewise form a (6, 4, 1) pattern for the detection of simultaneous activation of multiple word lines, which pattern additionally allows simple determination of the address of a word line from the associated bit pattern.

In a further exemplary embodiment, the redundancy against invasive error attacks is increased by the replication of marking bit patterns. If, by way of example, 4-tuples of bit patterns from M are considered with the property that in each case two 4-tuples differ by virtue of at least three of the four bit patterns from M, then in this manner it is possible for 272 bit patterns of length 24 to be found. These bit patterns thus form a (24, 8, 3) bit pattern set. The construction method described above likewise delivers a marking pattern of length 24 as an upper limit for a linear (12, 8, 3) code for $GF_2$.

By replicating bit marking patterns, it is possible for the techniques for efficient decoding of the address to be combined with the properties for the detection of multiple simultaneously activated word lines.

Figure 5:
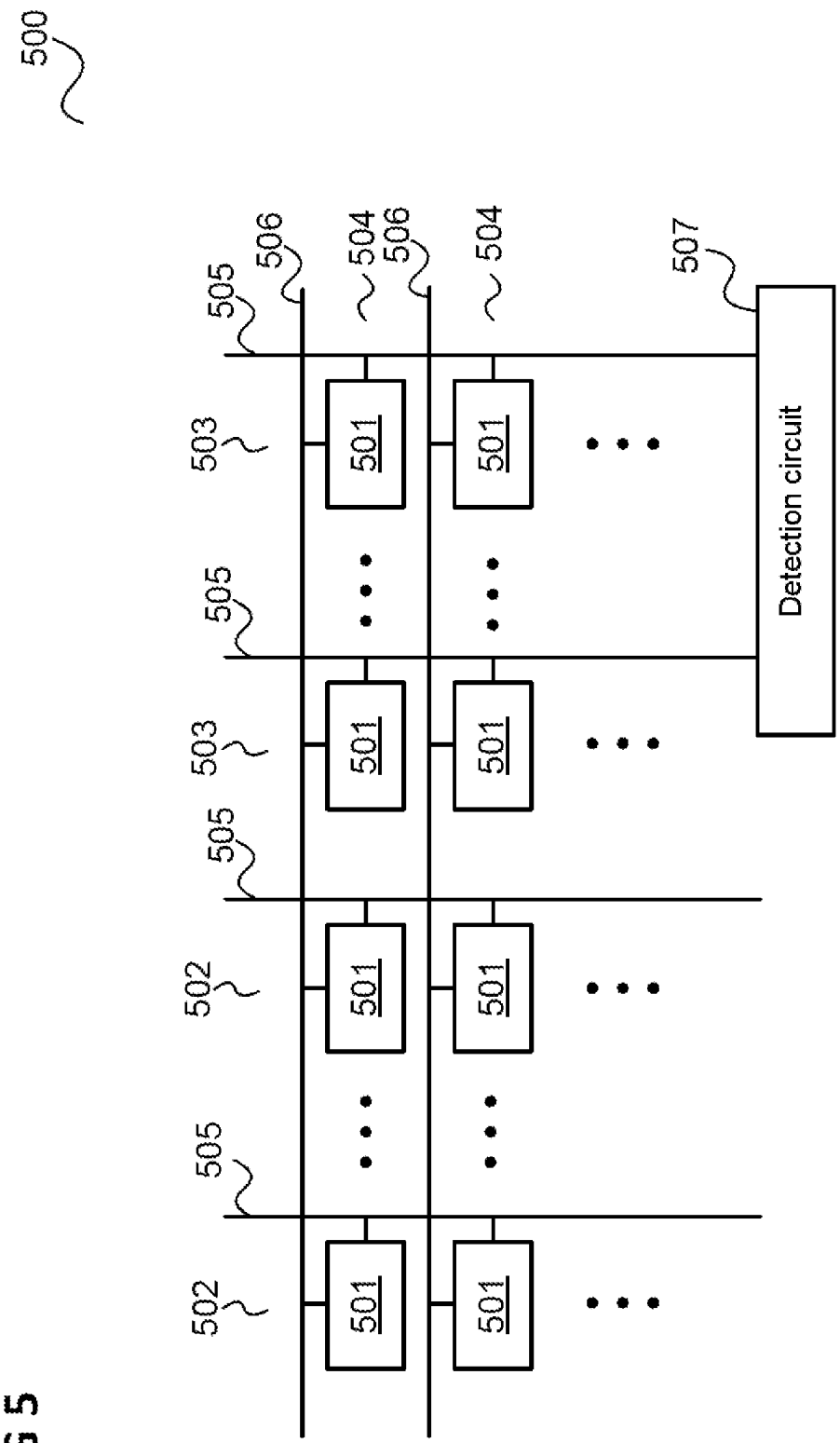
FIG. 5 shows a memory arrangement.

In summary, according to various embodiments, a memory arrangement is provided as depicted in FIG. 5.

FIG. 5 shows a memory arrangement 500.

The memory arrangement 500 has a memory cell array having columns 502, 503 and rows 504 of memory cells 501, bit lines 505 and word lines 506, wherein each column 502, 503 is associated with a bit line 505 and each row 504 is associated with a word line 506.

The columns 502, 503 of memory cells have columns of memory cells of a first column type 502, which are set up to store useful data, and have columns of memory cells of a second column type 503, which are set up to store prescribed verification data.

The memory cells of at least the columns of memory cells of the second column type 503 are set up, and connected to the bit lines 505, such that during a read access operation the memory cells 501 of a column 502, 503 of memory cells set the bit line associated with the column 503 to a value that corresponds to a logic combination of the values stored by the memory cells 501 in the column 503 that belong to rows of memory cells addressed during the read access operation.

The memory arrangement further has a detection circuit 507 that is set up so as, during a read access operation, to detect whether a bit line 505 associated with a column of memory cells of the second column type 503 is set to a value that corresponds to the logic combination of values stored by memory cells of the column of memory cells of the second column type 503 and whose values belong to different rows of memory cells.

In other words, according to various embodiments, memory cells having verification information are provided in a memory cell array whose memory cells are configured and connected to bit lines such that the simultaneous activation of multiple word lines, i.e. the simultaneous addressing of memory cells of different rows, results, on each bit line, in a logic combination of the content of the addressed memory cells connected to said bit line being output. On the basis of the verification information known in advance, a detection circuit can verify whether multiple word lines were activated at the same time for a read or write access operation.

The logic combination is a (bit-by-bit) AND combination (i.e. AND function) or a (bit-by-bit) OR combination (i.e. OR function), for example. According to various exemplary embodiments, the monotony of the logic functions AND and OR is used, for illustrative purposes, to achieve a change in the Hamming weight of the resultant bit pattern by means of the bit-by-bit logic combination of precomputed patterns that, according to one embodiment, are explicitly associated with the word lines of a memory array. In this case, repeated activation of word lines by the logic OR function of the respective bit patterns leads to the Hamming weight of the result rising by at least the value d. For a logic AND function, it falls by at least the value d.

The prescribed verification data are stored in a secure environment in the memory cells of the columns of memory cells of the second column type, for example. By way of example, the verification data can be stored in nonvolatile and possibly even unoverwritable fashion in the memory cells of the columns of memory cells of the second column type during a manufacturing process.

The memory arrangement provides a protection mechanism for electronic memories and can be used for securing various types of electronic memories. By way of example, the memory cells may be RAM (Random Access Memory), flash memory, RRAM (Resistive RAM) and FeRAM (Ferroelectric RAM) memory cells.

By way of example, the memory arrangement may be part of a memory that has further memory components such as an address decoder, etc. The memory may be arranged in an electronic apparatus, for example a chip card (of arbitrary form factor), a controller (e.g. connected to a microcontroller), e.g. in a vehicle, etc.

The text below specifies a few exemplary embodiments in summary.

Exemplary embodiment 1 is a memory arrangement as shown in FIG. 5.

Exemplary embodiment 2 is a memory arrangement based on exemplary embodiment 1, wherein the detection circuit has an alarm line and is set up to output an alarm signal via the alarm line if during the read access operation one or more bit lines respectively associated with a column of memory cells of the second column type are set to a value that corresponds to the logic combination of values stored by memory cells of the column of memory cells of the second column type and whose values belong to different rows of memory cells.

Exemplary embodiment 3 is a memory arrangement based on exemplary embodiment 1 or 2, wherein the verification data for each row of memory cells have a prescribed bit pattern, wherein the memory cells of the columns of memory cells of the second column type in the row of memory cells are set up to store the prescribed bit pattern.

Exemplary embodiment 4 is a memory arrangement based on one of exemplary embodiments 1 to 3, wherein the detection circuit is set up to detect whether a bit pattern to which the bit lines associated with the columns of memory cells of the second column type are set is set to a resultant bit pattern that corresponds to the logic combination of bit patterns of different rows of memory cells.

Exemplary embodiment 5 is a memory arrangement based on exemplary embodiment 4, wherein the detection circuit has an alarm line and is set up to output an alarm signal via the alarm line if the resultant bit pattern corresponds to the logic combination of bit patterns of different rows of memory cells.

Exemplary embodiment 6 is a memory arrangement based on exemplary embodiment 4 or 5, wherein the prescribed bit patterns each have a prescribed Hamming weight and the detection circuit is set up to take the Hamming weight of the resultant bit pattern as a basis for verifying whether the resultant bit pattern corresponds to the logic combination of bit patterns of different rows of memory cells.

Exemplary embodiment 7 is a memory arrangement based on one of exemplary embodiments 4 to 6, wherein the prescribed bit patterns of two different rows differ in at least one number of places that corresponds to a prescribed redundancy value.

Exemplary embodiment 8 is a memory arrangement based on exemplary embodiment 7, wherein the memory arrangement has the detection circuit as often as the prescribed redundancy value.

Exemplary embodiment 9 is a memory arrangement based on one of exemplary embodiments 1 to 8, wherein the memory cells of the columns of memory cells of the second column type are nonvolatile memory cells.

Exemplary embodiment 10 is a memory arrangement based on one of exemplary embodiments 1 to 9, wherein the memory cells of the columns of memory cells of the second column type are read-only memory cells.

Exemplary embodiment 11 is a memory arrangement based on one of exemplary embodiments 1 to 10, wherein the memory cells of the columns of memory cells of the first column type are volatile memory cells.

Exemplary embodiment 12 is a memory arrangement based on one of exemplary embodiments 1 to 11, wherein the detection circuit is set up to take a piece of information about an association of verification data with rows of memory cells as a basis for ascertaining which one or more word lines were activated during the read access operation.

It should be noted that all of the aforementioned exemplary embodiments can be combined with one another as desired.

Although the subject matter of the disclosure has been shown and described primarily with reference to particular embodiments, those familiar with the specialist field should understand that numerous changes can be made thereto in respect of configuration and details without departing from the essence and scope of the disclosure as defined by the claims that follow. The scope of the disclosure is thus determined by the appended claims, and the intention is for all changes that fall within the meaning of the word or the scope of equivalence of the claims to be covered.

The invention claimed is:

1. A memory arrangement, comprising:
   a memory cell array having columns and rows of memory cells, bit lines, and word lines,
   wherein each column is associated with a bit line and each row is associated with a word line;
   wherein the columns of memory cells have columns of memory cells of a first column type that are configured to store primary data, and have columns of memory cells of a second column type that are configured to store prescribed verification data;
   wherein the memory cells of at least the columns of memory cells of the second column type are configured, and connected to the bit lines, such that during a read access operation the memory cells of a column of memory cells of the second column type set the bit line associated with the column of memory cells of the second column type to a value that corresponds to a bit-line or column-line logic combination of the prescribed verification data stored by the memory cells of the column of memory cells of the second column type that belong to rows of memory cells addressed during the read access operation; and
   a detection circuit configured to, during the read access operation, detect whether the bit lines associated with the column of memory cells of the second column type are set to a value that corresponds to the bit-line or column-line logic combination of the prescribed verification data stored by the memory cells of the column of memory cells of the second column type whose values belong to at least two different rows of memory cells,
   wherein the prescribed verification data stored in each row of memory cells of the second column type has a respective prescribed bit pattern, each with the same prescribed Hamming weight.

2. The memory arrangement as claimed in claim 1, wherein the detection circuit comprises an alarm line and is configured to output an alarm signal via the alarm line if one or more bit lines each associated with the column of memory cells of the second column type are (i) set, during the read access operation, to the value that corresponds to the bit-line or column-line logic combination of the prescribed verification data stored by memory cells of the column of memory cells of the second column type, and (ii) have different values that belong to the rows of the different rows of memory cells addressed during the read access operation.

3. The memory arrangement as claimed in claim 1, wherein the detection circuit comprises an alarm line and is configured to output an alarm signal via the alarm line if the resultant bit pattern corresponds to the bit-line or column-line logic combination of bit patterns of different rows of memory cells.

4. The memory arrangement as claimed in claim 1, wherein the prescribed bit patterns each have a prescribed Hamming weight and the detection circuit is configured to take the Hamming weight of the resultant bit pattern as a basis for verifying whether the resultant bit pattern corresponds to the bit-line or column-line logic combination of bit patterns of different rows of memory cells.

5. The memory arrangement as claimed in claim 1, wherein the prescribed bit patterns of two different rows differ in at least one location corresponding to a prescribed redundancy value.

6. The memory arrangement as claimed in claim 5, wherein the memory arrangement comprises a number of detection circuits equal to the prescribed redundancy value.

7. The memory arrangement as claimed in claim 1, wherein the memory cells of the columns of memory cells of the second column type are nonvolatile memory cells.

8. The memory arrangement as claimed in claim 1, wherein the memory cells of the columns of memory cells of the second column type are read-only memory cells.

9. The memory arrangement as claimed in claim 1, wherein the memory cells of the columns of memory cells of the first column type are volatile memory cells.

10. The memory arrangement as claimed in claim 1, wherein the detection circuit is configured to ascertain, based on information about an association of verification data with rows of memory cells, which one or more word lines were activated during the read access operation.

11. The memory arrangement as claimed in claim 4, wherein the detection circuit comprises an alarm line and is configured to output an alarm signal via the alarm on the basis of the Hamming weight of the resultant bit pattern being greater than the Hamming weight of the different rows of the rows of memory cells addressed during the read access operation.

12. The memory arrangement as claimed in claim 1, wherein the same prescribed Hamming weight associated with the prescribed verification data stored in each row of memory cells of the second column type is less than a number of bits associated with the prescribed verification data.

* * * * *